(12) United States Patent
Simpson et al.

(10) Patent No.: US 6,884,514 B2
(45) Date of Patent: Apr. 26, 2005

(54) METHOD FOR FORMING CERAMIC LAYER HAVING GARNET CRYSTAL STRUCTURE PHASE AND ARTICLE MADE THEREBY

(75) Inventors: Matthew A. Simpson, Sudbury, MA (US); Dominique Billieres, Avignon (FR); Gérard Main, Viroflay (FR); Jean-Michel Drouin, Maisons Laffitte (FR)

(73) Assignee: Saint-Gobain Ceramics & Plastics, Inc., Worcester, MA (US)

( * ) Notice: Subject to any disclaimer, the term of this patent is extended or adjusted under 35 U.S.C. 154(b) by 22 days.

(21) Appl. No.: 10/044,744

(22) Filed: Jan. 11, 2002

(65) Prior Publication Data

US 2003/0134134 A1 Jul. 17, 2003

(51) Int. Cl.$^7$ ................................................. B32B 9/04
(52) U.S. Cl. ...................... 428/469; 428/332; 428/446; 428/701; 428/702; 428/699
(58) Field of Search ................................. 428/469, 701, 428/702, 332, 699, 446; 427/453

(56) References Cited

U.S. PATENT DOCUMENTS

| | | |
|---|---|---|
| 4,946,241 A | 8/1990 | Krumme et al. |
| 6,015,630 A | 1/2000 | Padture et al. |
| 6,106,959 A | 8/2000 | Vance et al. |
| 6,248,220 B1 | 6/2001 | Seon |
| 6,310,937 B1 | 10/2001 | Van Den Hoogenhof |
| 6,326,076 B1 | 12/2001 | Takai |
| 6,383,964 B1 | 5/2002 | Nakahara et al. |
| 6,447,937 B1 | 9/2002 | Murakawa et al. |
| 6,492,042 B1 * | 12/2002 | Morita et al. |
| 2001/0003271 A1 | 6/2001 | Otsuki |
| 2001/0018921 A1 | 9/2001 | Yamada et al. |

FOREIGN PATENT DOCUMENTS

| | | |
|---|---|---|
| JP | 5021628 | 1/1993 |
| JP | 79029380 | 3/1993 |
| JP | 343985 | * 12/2001 |
| JP | 410364 | * 3/2002 |

OTHER PUBLICATIONS

Abstract of Yttrium aluminum garnet (YAG) films through a precursor plasma spraying technique. Parukuttyamma, Sujatha D.; Margolis, Joshua; Liu, Haiming; Grey, Clare P.; Sampath, Sanjay; Herman, Herbert; Parise, John B. Center for Thermal Spray Research, Department of Materials Science and Engineering, Department of Chemistry, State University of New York, Stony Brook, NY, USA. J. Am. Ceram. Soc. (2001), 84(8), 1906–1908. CODEN: JACTAW ISSN: 0002–7820. Journal written in English.

Abstract of Sputter–deposited yttria–alumina thin films for optical waveguiding; Stadler BJH, Oliver M.; Journal of Applied Physics; 84 (1): 93–99 Jul. 1, 1998; Document type: Article—Language: English.

Abstract of Film synthesis of Y3Al5O12 and Y3Fe5O12 by the spray–inductively coupled plasma technique. Mizoguchi, Yoshihito; Kagawa, Masahiro; Syono, Yasuhiko; Hirai, Toshio. Institute for Materials Research, Tohoku University, Sendai, Japan. J. Am. Ceram. Soc. (2001), 84(3), 651–653. CODEN: JACTAW ISSN: 0002–7820. Journal written in English.

(Continued)

*Primary Examiner*—Jennifer McNeil
(74) *Attorney, Agent, or Firm*—Toler, Larson & Abel, LLP; Thomas G. Field, III

(57) ABSTRACT

A method of depositing a coating is disclosed, which method calls for providing a substrate, and thermally spraying a ceramic powder thereon to form a coating. The ceramic powder has a garnet crystal structure phase, and the thermal spraying in turn forms a coating on the substrate that includes a garnet crystal structure phase.

14 Claims, 5 Drawing Sheets

OTHER PUBLICATIONS

Abstract of Non-equilibrium phase synthesis in AI2O3–Y2O3 by spray pyrolysis of nitrate precursors. Ullal, C. K.; Balasubramaniam, K. R.; Gandhi, A. S.; Jayaram, V. Department of Metallurgy, Indian Institute of Science, Bangalore, India. Acta Mater. (2001), 49(14), 2691–2699. CODEN: ACMAFD ISSN: 1359–6454. Journal written in English.

Abstract of Comparison of solid–state and spray–pyrolysis synthesis of yttrium aluminate powders. Nyman, May; Caruso, James; Hampden–Smith, Mark J. Dep. Chem. Center Micro–Engineered Ceramics, Univ. New Mexico, Albuquerque, NM, USA. J. Am. Ceram. Soc. (1997), 80(5), 1231–1238. CODEN: JACTAW ISSN: 0002–7820. Journal written in English.

Abstract of Gas–phase synthesis of ultrafine particles and thin films of yttrium–aluminum oxide by the spray–ICP technique. Kagawa, M.; Suzuki, M.; Mizoguchi, Y.; Hirai, T.; Syono, Y. Inst. Mater. Res., Tohoku Univ., Sendai, Japan. J. Aerosol Sci. (1993), 24(3), 349–55. CODEN: JALSB7 ISSN: 0021–8502. Journal written in English.

Abstract of Plasma–sprayed alumina–yttria ceramic coatings for cavitation–erosion protection. Kim, Hue Jae. Dep. Ordnance Eng., Korea Mil. Acad., S. Korea. Han'guk Pusik Hakhoechi (1989), 18(3), 139–46. CODEN: HPHADI ISSN: 0253–312X. Journal written in English.

Abstract No. No.: A9822–6855–033; Authors: Esparza, A.; Garcia, M.; Falcony, C.; Corp Source: Dept. de Fisica, Centro de Investigacion Y de Estudios Avanzados, IPN, Mexico City, Mexico; Title: Structural and photoluminescent characteristics of yttrium–aluminum oxide films doped with Tb,Eu or Ce; Source: Thin Solid Films, vol. 325, No. 1–2 p. 14–18; ISSN: 0040–6090 CODEN: THSFAP; Publication: Switzerland; Language: English. Publisher: Elsevier; Year: Jul. 18, 1998; Copyright No: 0040–6090/98; Record Type: Journal Paper.

Abstract No. A79034025; Authors: Korotkov, N.A.; Zaitsev, A.A.; Lazarev, E.M.; Title: Electron diffraction study of phase transformations in thin films of Y/sub 2/Osub 3/–Al/sub 2/Osub 3; Source: Izvestiya Nauk SSSR, Metally, No. 4 p. 251–5; ISSN: 0568–5303; CODEN: IZNMAQ; Publication: USSR; Translated In: Russian Metallurgy; ISSN: 0036–0295; CODEN: RMLYAQ; Country: UK; Language: English; Year: Jul.–Aug. 1978; Record Type: Journal Paper.

Abstract No. 00499604/7; Energy SciTec| CZ–(c) 2001. Analytic Electron diffraction investigation of phase transformations in thin Y/sub 2/O/sub 3/–Al/sub 2/O/sub 3 films. Authors: Korotkov, N.A;. Zajtsev, A.A.; Lararev, E.M. Izv. Akad. Nauk SSSR, Met. (USSR) SO– VO 4| CO– IZNMA| SO– Jul.–Aug. 1978 SO; 251–255; Language: Russion.

Ezaki, et al., "Characterization of ND: Y3A15012 Thin Films Grown on Various Substrates by Pulsed Laser Deposition", Applied Physics Letters, American Institute of Physics, New York, US, vol. 69, No. 20, Nov. 11, 1996, pp. 2977–2979.

Jablonshi, et al., "ESR and X–ray Diffraction Measurements of Nd Substituted Yttrium Aluminum Garnet Films", Journal of Alloys and Compounds, Elsevier Sequoia, Lausanne, CH, vol. 300–301, Apr. 2000, pp. 316–321.

Su, et al., "In Situ Characterization of Small–Particle Plasma Sprayed Powders", Journal of Thermal Spray Technology, vol. 11, No. 1, Mar. 2002, pp. 52–61.

* cited by examiner

METHOD FOR FORMING CERAMIC LAYER HAVING GARNET CRYSTAL STRUCTURE PHASE AND ARTICLE MADE THEREBY

CROSS-REFERENCE TO RELATED APPLICATION(S)

BACKGROUND

1. Field of the Invention

The present invention relates generally to methods for depositing a coating on a substrate, and more particularly, to methods for depositing a coating by using a thermal spraying technique to form a coating having a garnet crystal structure phase.

2. Description of the Related Art

Ceramic materials having the garnet crystal structure, such as rare-earth aluminates, have been identified as potential materials in various industry applications, and have been of particular interest in industry areas ranging from semiconductor processing to aircraft and land-based turbine engine fabrication. In particular, garnet structured ceramic materials have been identified as having useful properties, including high-temperature strength, such as at elevated temperatures on the order of 1300° C. and higher. In addition, garnet ceramics are resistant to corrosion from reactive materials such halogens and acids. Such problems are especially acute in semiconductor processing. Silicon wafers are typically etched in reactors using halogen radicals that are extremely corrosive. It is important that the immediate environment of the wafer (which typically consists of chamber walls with some kind of lid and an electrostatic chuck to hold the wafer) not corrode rapidly, otherwise small particles of eroded material may fall on the wafer and create fatal defects.

As is understood in the art, it is generally difficult to fabricate large ceramic components from a uniform or monolithic ceramic composition. In particular, it is generally difficult to form large, dense ceramic components, as thermal stresses and non-uniformities tend to produce cracking in the component. Accordingly, techniques for depositing ceramic materials, including garnet structure ceramic materials, have been investigated. In this context, coatings of garnet ceramics generally play a role as thermal, chemical or mechanical barriers, which function to protect the underlying substrate.

Several techniques have been employed in the art to deposit garnet ceramics on substrates. In one such technique, raw materials including aluminum and yttrium raw materials are deposited using RF magnetron sputtering. However, this technique suffers from several disadvantages. For example, the sputtering technique cannot produce robust coatings having a thickness greater that about 5 microns, which thickness is generally desirable for corrosion protection. In particular, the process is slow and expensive, and thick coatings generally delaminate from underlying substrate due to internal residual stresses in the coating.

Another technique attempts to deposit yttrium aluminum garnet (known in the art as "YAG"), having the nominal composition $Y_3Al_5O_{12}$ coatings by a thermal spray process. In this technique, liquid precursors including suspensions of elemental or compounds of yttrium and aluminum are fed to an RF induction plasma torch, and thermally sprayed to form a coating. Here, the coating as-sprayed was found to have the perovskite phase, and a subsequent high temperature exposure was executed to convert the perovskite phase to the garnet phase.

While the foregoing thermal spray process provides significantly higher deposition rates than the above-described sputtering process, the secondary heat treatment step to effect phase transformation of the deposited coating is problematic. In particular, the temperatures at which the heat treatment step is executed have a tendency to damage or affect the structural integrity of certain types of underlying substrates such as aluminum-based alloys.

Accordingly, the present inventors have recognized a need in the art to provide improved processes for forming garnet ceramic coatings.

SUMMARY

In one aspect of the present invention, a method is provided for depositing a coating on a substrate. In this method, a ceramic powder including a garnet crystal structure phase is thermally sprayed onto the substrate thereby forming a desired coating. The coating includes the garnet crystal structure phase. In another aspect of the invention, an article is provided including a substrate and a garnet crystal structure coating overlying the substrate. In the foregoing article, the substrate has a coefficient of thermal expansion that is at least about 30 percent different (i.e., greater or less than) than the thermal expansion coefficient of the coating. In addition, the coating is relatively thick, having a thickness of at least 10 microns. Additional aspects of the present invention are drawn to semiconductor processing tools as well as methods for forming semiconductor devices.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DESCRIPTION OF THE PREFERRED EMBODIMENT(S)

Figure 1:
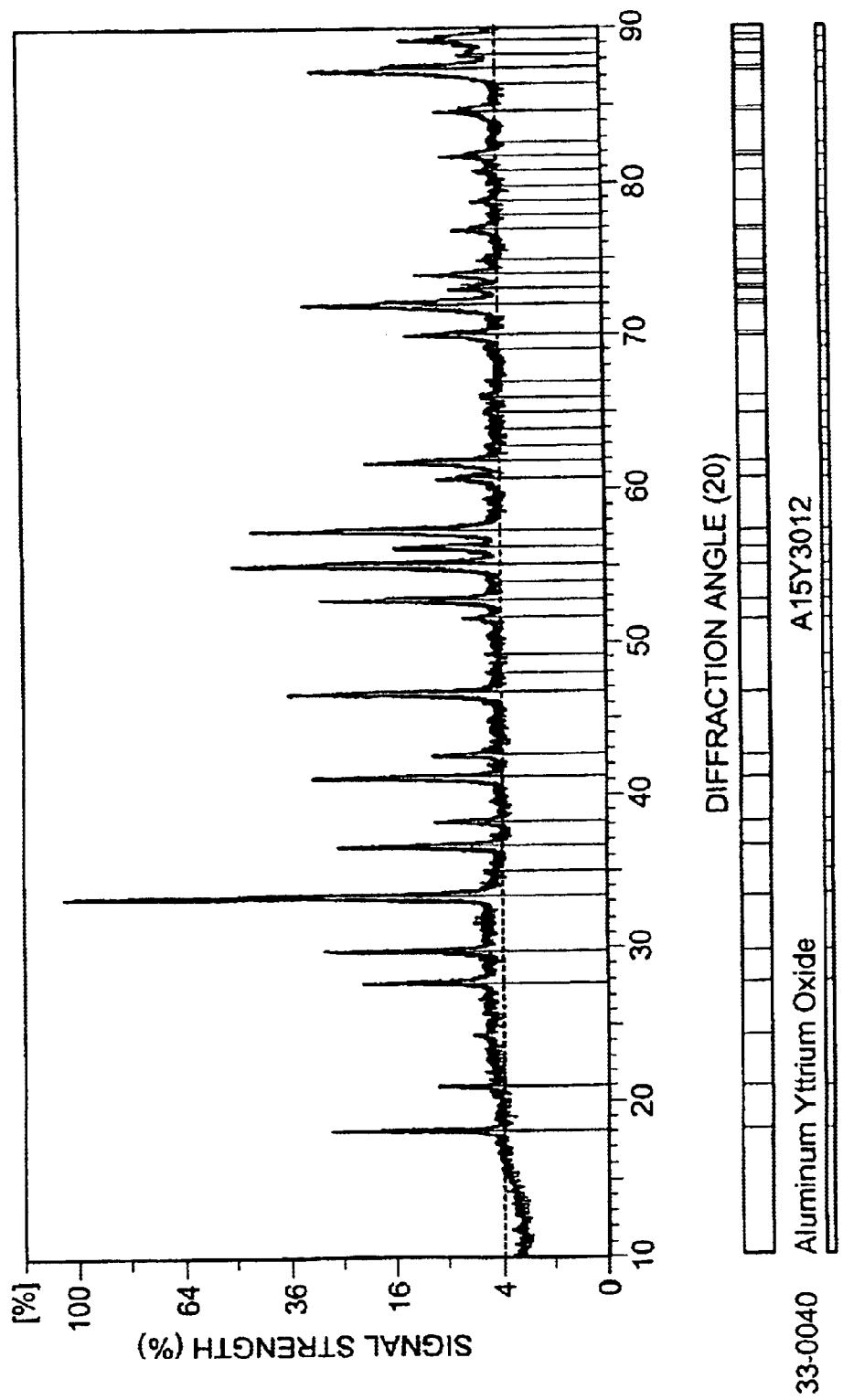
FIG. 1 illustrates an X-ray diffraction chart representing the crystal structure of an embodiment of the present invention in which yttrium aluminum garnet (YAG) ceramic material was deposited on an alumina substrate.

Turning to particular embodiments of the present invention, a method is provided for depositing a coating, which includes providing a substrate, and thermally spraying a ceramic powder on the substrate to form a coating. According to a particular feature of the present invention, the powder includes a garnet crystal structure phase. The resulting coating also includes the garnet crystal structure phase.

The particular form of a substrate may vary widely, and includes semiconductor processing components (e.g., reactive chambers and etch reactors) and superalloy turbine engine components (e.g., turbine rotors). The particular materials of the substrate may also vary widely, and include metals and non-metals, including ceramic materials. Metal substrates preferably include at least one of molybdenum, tungsten, iron, nickel, aluminum, titanium and combinations thereof. As used herein, the term "metal" includes not only elemental metals, but metal alloys as well. In this regard, various industrial applications call for use of aluminum alloy, for cost and ease of forming/machining. For example, many semiconductor processing components are formed of aluminum alloys. Alternatively, in the case of metals, the substrate may commonly be formed of a stainless steel alloy. In the case of non-metals, the substrate may be formed of elemental silicon. Alternatively, the substrate may be formed of a ceramic or glassy material such as alumina or silica.

While the garnet coating may be deposited directly on the substrate, intermediate layer(s) may be present between the substrate and the coating. The precise nature and composition of the layers are determined based on the intended use and environment of the coated article. Exemplary intermediate coatings include bonding layers, oxidation and corrosion resistant layers, barrier layers (e.g., to prevent migration of components within the substrate to the outer surface), and others. They may be in the form of a chemical vapor deposited layer, physical vapor deposited layer, oxidized layer, reacted layer, and an anodized layer. An exemplary composition is boron carbide.

Turning to the ceramic powder that is used in the thermal spraying, it is particularly important that the powder include a garnet crystal structure phase. More particularly, the powder generally comprises $M_3Al_5O_{12}$ having the garnet crystal structure, wherein M includes at least one element from the group consisting of yttrium, scandium, lanthanide series elements, and combinations thereof. In one particular embodiment, M includes at least yttrium, and the powder is principally formed of yttrium aluminum garnet, known in the art as "YAG". In addition, M may include yttrium in a combination with any one of or several elements that include scandium and lanthanide series elements. Typically, the total sum of the scandium and lanthanide series elements is not greater than 20 mol % with respect to the total amount of M (including Y). The YAG powder may be formed of stoichiometrically correct or accurate yttrium aluminum garnet. Alternatively, the stoichiometry of the YAG powder may be slightly shifted such as by having a slightly rich (such as 2 percent by mass) yttrium content.

YAG belongs to the isostructural garnet family of ceramics having the general formula $Y_3{}^CAl_2{}^AAl_3{}^DO_{12}$, where C, A, and D are special sites in the garnet crystal. The "A" site is octahedrally coordinated with respect to oxygen, the "C" site is tetrahedrally coordinated with respect to oxygen, and the "D" site is dodecahedrally coordinated with respect to oxygen. In the case of YAG, all of the $Y^{3+}$ sites occupy the "C" sites. Two fifths of the $Al^+$ atoms occupy the "A" sites, and the remainder of the $Al^{1+}$ atoms occupy the "D" sites.

As used herein, "garnet" includes the YAG ceramic itself, and any member of the garnet family of ceramics in which all or part of the $Al^{3+}$ on the A and/or D sites may be substituted by one or a mixture of other trivalent elements, such elements including, but not being limited to, iron, gallium, scandium, and the like. Substitution of all of the $Al^{3+}$ atoms by $Fe^{3+}$, for example, results in $Y_3Fe_5O_{12}$ (yttrium iron garnet, YIG). Thus, there is complete solid solubility between YAG and YIG, with a general formula $Y_3Al_{5-x}Fe_xO_{12}$, where x varies from 0 to 5. Similarly, garnets include ceramics wherein the yttrium on the site C is replaced in part or in whole by a combination of rare earth elements as well as scandium.

The particle size distribution and average particle size characteristics of the ceramic powder may be chosen by one of ordinary skill in the art, based upon the details of the thermal spraying process. An embodiment of the present invention includes ceramic powders having particle size ranges within about 1 to 100 microns, such as 5 to about 75 microns. The particular size ranges are described in more detail below in connection with the examples.

Like the ceramic powder, the resulting coating formed by thermal spraying also has a garnet crystal structure phase. Typically the coating has the same stoichiometric composition and crystal structure (phase) as those of the ceramic powder used for thermal spraying. Accordingly, the foregoing description with respect to the composition of the ceramic powder applies to the coating as well. Preferably, the garnet crystal structure phase is the predominant phase of the coating. The prevalence of the garnet crystal structure phase may be measured by exposing samples of deposited coating to X-ray diffraction analysis. Embodiments of the present invention may have a maximum peak height of crystalline phases (other than the garnet crystal structure phase) that is less that 10% of the maximum peak height of the garnet crystal phase. Other embodiments show that such a maximum peak height of other crystalline phases to be less than 5% of the maximum peak height of the garnet crystal structure phase.

Like the ceramic powder used for thermal spraying, the coating includes $M_3Al_5O_{12}$ having the garnet crystal structure, where an M includes at least one element from the group consisting of yttrium, scandium, lanthanide series elements, and combinations thereof. In one particular embodiment, M includes at least yttrium, which forms yttrium aluminum garnet (YAG). In this case, the YAG coating may be formed of principally stoichiometrically correct yttrium aluminum garnet, or may be slightly rich (up to an additional two percent by mass) in yttrium.

Further, the yttrium of the YAG coating may be partially replaced with another rare earth element. As used herein, the term "rare earth element" includes not only the lanthanide series elements, but also yttrium and scandium as well. In addition, M may include yttrium in a combination with any one of or several elements that include scandium and lanthanide series elements. Typically, the total sum of the scandium and lanthanide series elements is not greater than 20 mol % with respect to the total amount of M (including Y). In one particular embodiment, the YAG coating further includes neodymium (Nd), which may be effective to modify the color of the coating, by making it slightly darker.

Partial replacement of the aluminum with other elements may also be used to modify the properties of the coating. Chromium additions, sometimes with other additive elements such as Tm or Ca, can impart strong coloration to the coating.

According to an embodiment of the present invention, the ceramic powder is thermally sprayed by use of a plasma torch. Here, the starting material, the ceramic powder including the garnet phase, is fed to the plasma torch for thermal spraying in a fluid medium, either through gas flow or in a liquid (e.g., aqueous) suspension.

The substrate upon which the coating is formed may be preheated prior to thermal spraying. It has been found that the preheating step is beneficial to promote adhesion between the substrate and the coating overlying the substrate. Preheating temperatures generally are about 150° C.

or higher, and particular embodiments were preheated to a temperature to about 200° C. Preheating may be important for a range of substrate materials, including ceramics such as alumina, and metal substrates such as aluminum and anodized aluminum. However, preheating is particularly preferable for alumina and anodized aluminum substrates.

According to embodiments of the present invention, the coating contains the garnet crystal phase in its as deposited form. Accordingly, post-deposition heat treatments do not need to be carried out, such as in the case of prior art processes that rely on post-deposition heat treatment to effect phase transformation into the garnet crystal phase. This aspect of the present invention advantageously permits use of substrate materials that do not have robust refractory properties, such as many aluminum alloys that are used for fabricating semiconductor processing components. In addition, embodiments of the present invention are particularly adapted for depositing coatings on substrates that have a widely varying thermal expansion coefficient from that of the deposited garnet ceramic material. Since a post-deposition heat treatment does not need to be carried out, problems with delamination of the coating from the substrate are overcome. In this regard, it is noted that while relatively thin coatings (such as on the order of less than five microns) can survive delamination during post-deposition heat treatment steps, thicker coatings typically do not.

Accordingly, another embodiment of the present invention provides for a coated article including a substrate and a relatively thick coating overlying the substrate, the thick coating having a garnet crystal structure phase. Here, the substrate has a coefficient of thermal expansion that is at least about 30 percent different (i.e., greater than or less than) the thermal expansion coefficient of the coating. In one embodiment of the present invention, the coefficient of thermal expansion of the substrate is at least about 40 percent greater than or less than the thermal expansion coefficient of the coating. For example, YAG has a coefficient of thermal expansion (CTE) of about $9.1 \times 10^{-6}$/K. Accordingly, the underlying substrate may have a thermal expansion coefficient less than about $6.4 \times 10^{-6}$/K or greater than about $11.8 \times 10^{-6}$/K.

As stated above, the coating overlying the substrate is relatively thick, having a thickness greater than about five microns. Particular embodiments include coatings having a thickness greater than about 10 microns, and other embodiments having a thickness greater than about 50 microns, and greater than about 100 microns. The particular materials for the substrate and the coating are as otherwise described herein.

Turning to particular working examples of embodiments of the present invention, numerous coated articles were formed by feeding YAG powder to a TS7 plasma torch, made by SNMI of Avignon, France. The following nominal process parameters were utilized for the plasma torch. Argon and hydrogen gases were flowed to the torch at nominal flow rates of about 43 liters per minute and 8 liters per minute, respectively. Current was held at 550 amps, and voltage was held at 68 volts. The injector diameter was 1.8 mm, the angle of injection was held at 90 degrees (relative to gas flow), the distance of the powder injection to the anode was within a range of about 6 to 8 mm, and the standoff between the anode and the substrate was 90 mm. The ceramic powder was provided in a gas mixture and fed to the plasma torch within a range of about 2.5 to 4.0 liters per minute. Of those samples that were preheated, the substrate was preheated to a temperature of about 200° C. Two different methods to affect the cooling rate of the deposit were investigated. In one (called "air blowing" below), air was flowed in a direction parallel to the plasma jet onto the substrate in order to maximize cooling rate. In the other (called "gas barrier" below) a flat jet of air was blown at right angles to the plasma jet at about 60 mm from the anode. This flat jet separated somewhat the particles from the hot gases from the plasma jet, thereby reducing the cooling rate. Temperature quenching during plasma spraying was carried out by either air blowing or by implementing a gas barrier.

EXAMPLE 1

A commercially available stoichiometrically accurate yttrium aluminum garnet powder having a nominal particle size within a range of about 5 to about 45 microns was fed to a plasma torch according to the general conditions described above. The plasma torch was held at a level of 37.4 kW. Thermal spraying was carried out on an alumina substrate that was not preheated. The plasma spray was quenched by air blowing.

EXAMPLE 2

Example 2 was prepared in the same manner as example 1, except that the substrate was preheated at a temperature of about 220° C., the plasma torch was held at a power level of 34.1 kW, and the plasma spray was quenched via implementation of a gas barrier.

EXAMPLE 3

Example 3 as prepared in a manner identical to example 1, except that the ceramic powder had a slightly shifted yttrium content, particularly, the powder was rich in yttrium by an amount of two percent by mass. The particles size of this powder was within a range of about 10 to about 63 microns.

EXAMPLE 4

Example 4 was prepared in a manner identical to example 3, except that the substrate was preheated to a temperature of about 220° C., the plasma torch was held at a power level of 34.1 kW, and the plasma was quenched by implementation of a gas barrier.

EXAMPLE 5

Example 5 was prepared in the same manner as Example 2, except that the substrate was formed of 6061 aluminum and the substrate was not preheated.

The coated samples were then prepared for and exposed to X-ray diffraction analysis for determination of phases present in the coating. As is known in the art, X-ray diffraction analysis is carried out by irradiating by means of a monochromatic X-ray beam a sample. The X-ray beam is deflected only at given angles (whose value 2 theta is measured relative to the forward beam) due to the regularity of the crystal structure of the sample. The diffraction angles provide information with respect to crystal structure of the sample.

The searched crystal phases included $YAlO_3$ (perovskite structure), $Al_2Y_4O_9$ (monolithic crystal structure), $Y_3Al_5O_{12}$ (garnet crystal structure), $AlYO_3$ (orthorhombic crystal structure), $Al_2O_3$ (corundum), and $Y_2O_3$ (yttria).

Examples 1 and 2 showed very clear patterns of $Y_3Al_5O_{12}$, the YAG crystal structure. No other phases were detected. Accordingly, from the X-ray diffraction analysis, examples 1 and 2 are believed to be formed of entirely YAG.

Examples 3 and 4 were also composed principally of YAG. However, in example 3, AlYO$_3$ was detected in an amount of about 4%. In addition, AlYO$_3$ was detected in example 4 in an amount of about 7%. Here percentages were calculated from the relative intensity of the most intense x-ray diffraction peak of YAG at 0.269 mn plane spacing and the most intense x-ray diffraction peak of AlYO$_3$ at 0.262 nm.

Testing of the foregoing examples and additional examples were also carried out to determine the adhesion of the coating to the substrate. It was found that those examples that were preheated during thermal spraying showed superior adhesion. Those examples that were not preheated showed a tendency to delaminate from the surface of the substrate. In addition, testing was carried out to determine the tensile breaking stress of the coatings. The measured values fell within a range of about 40 to 80 MPa. Noteworthy, it was discovered that for the examples preheated, failure during testing usually occurred within the coating, not along the interface between the substrate and the coating.

Figure 2:
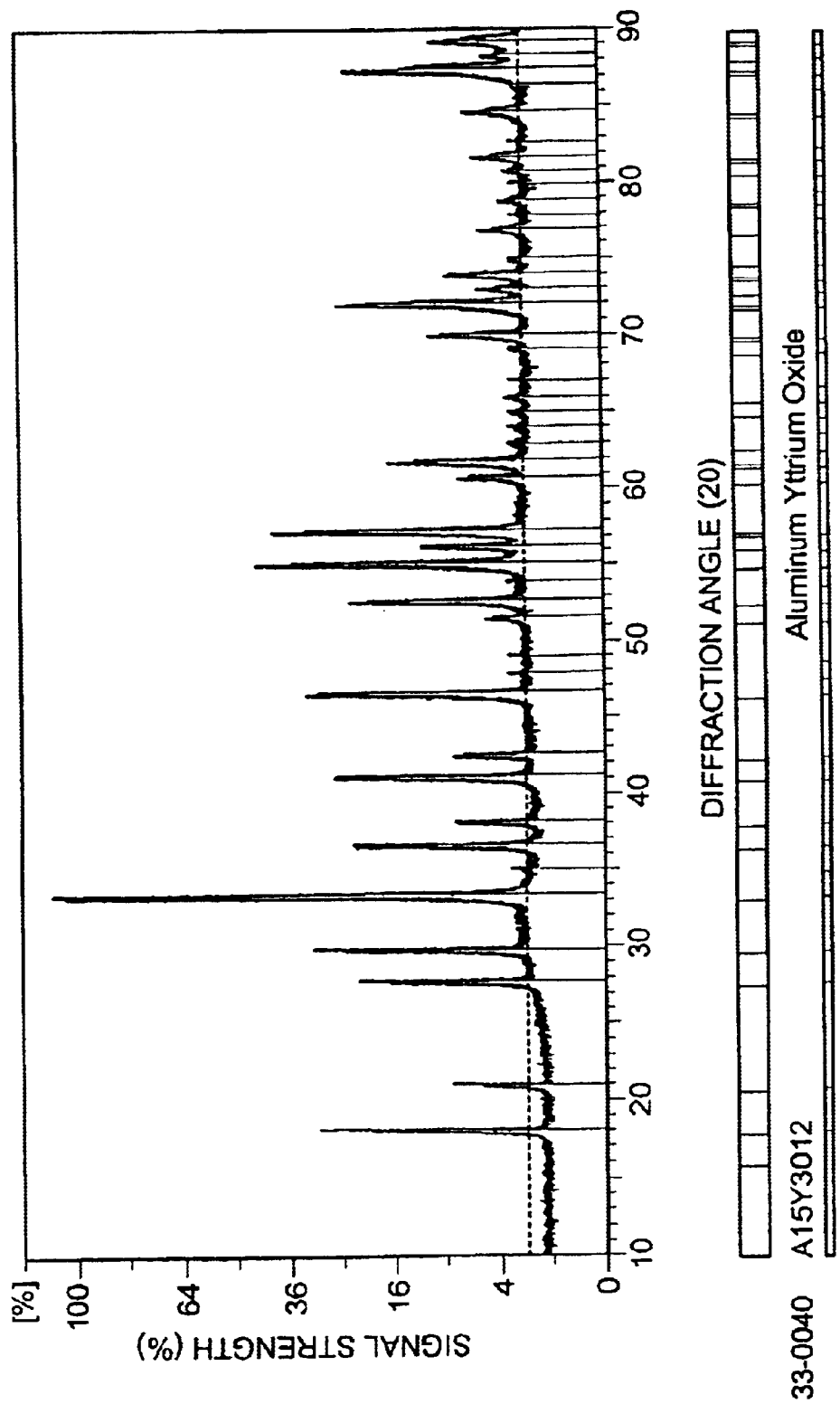
FIG. 2 illustrates an X-ray diffraction chart representing the crystal structure of an embodiment of the present invention in which yttrium aluminum garnet (YAG) ceramic material was deposited on an aluminum substrate.

Turning to the drawings, FIG. 1 represents the X-ray diffraction pattern generated from a working example in which YAG ceramic powder was thermally sprayed onto an alumina substrate following the general thermal spray conditions specified above. As shown, the sample exhibited a very clean X-ray diffraction pattern corresponding to the YAG crystal structure, according to ASTM 33-0040. FIG. 2 is similar to FIG. 1, illustrating the diffraction pattern of a YAG coating deposited on an aluminum substrate.

Figure 3:
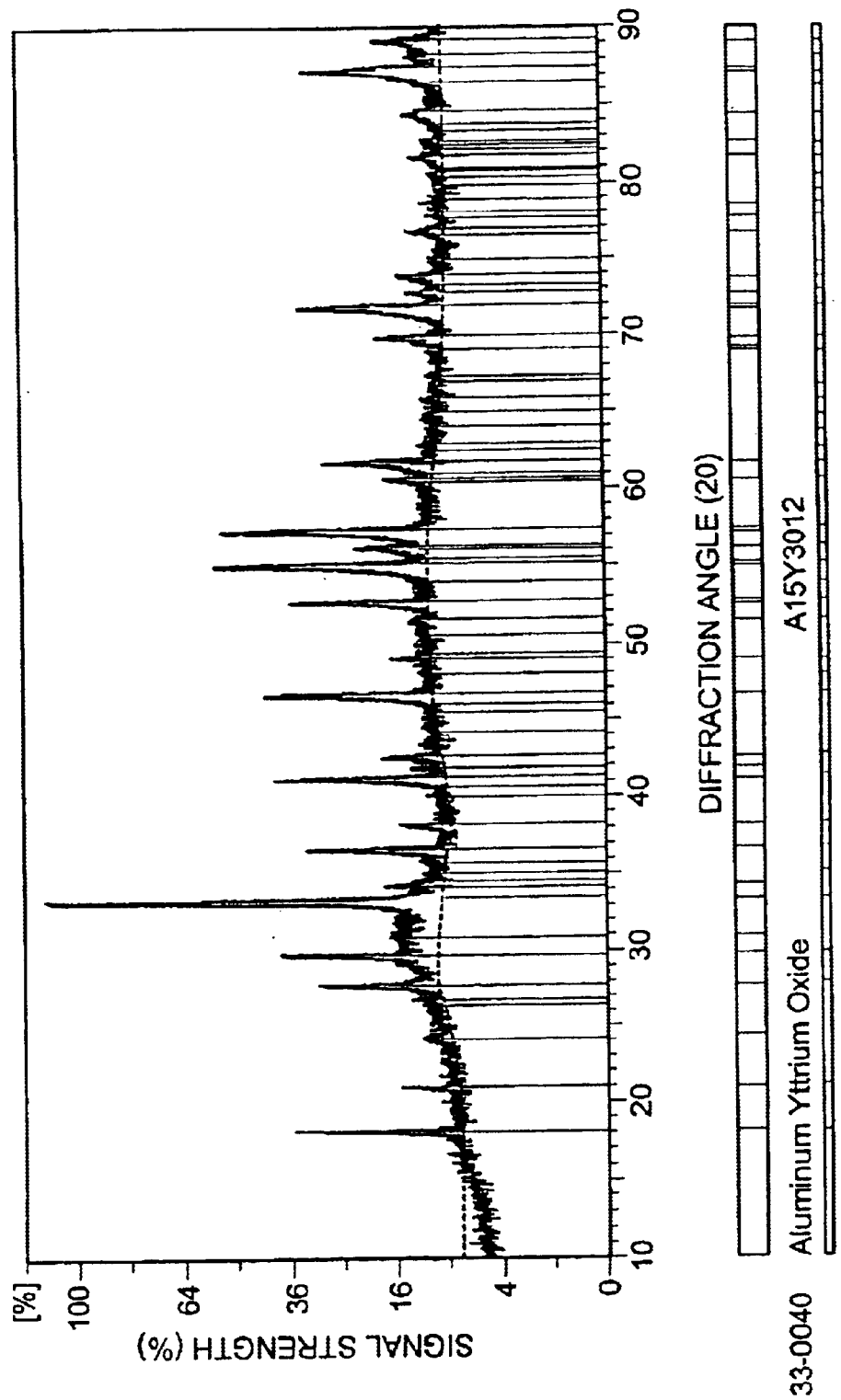
FIG. 3 illustrates an X-ray diffraction chart representing the crystal structure of another embodiment of the present invention in which yttrium aluminum garnet (YAG) ceramic material was deposited on an alumina substrate.

FIG. 3 illustrates the diffraction pattern of a YAG coating according to an embodiment of the present invention, wherein the ceramic powder utilized (the raw material) had a slightly rich yttrium content (2% by weight). The diffraction pattern shown in FIG. 3 showed what appears to be a modest amount of a secondary phase that might be YAlO$_3$.

Figure 4:
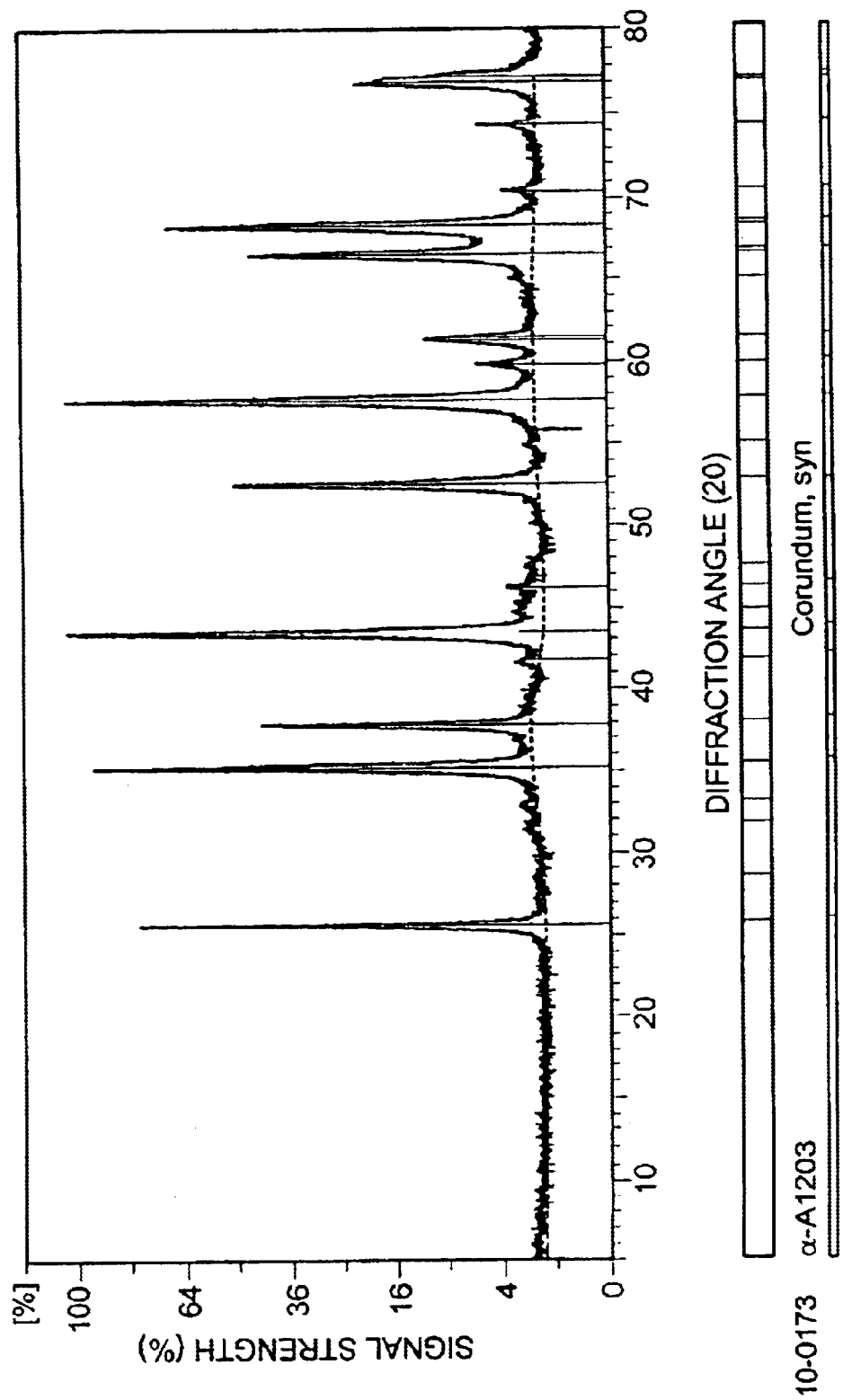
FIG. 4 illustrates the X-ray diffraction chart of alpha-alumina (corundum), for comparative purposes.

FIG. 4 illustrates an X-ray diffraction pattern of alumina (Al$_2$O$_3$) having the corundum crystal structure. This X-ray diffraction pattern is included in the drawings for comparative purposes to demonstrate that the YAG coatings in FIGS. 1 through 3 contain no appreciable amount of alpha-alumina. This is significant, as this particular phase tends to etch more readily than YAG coatings, and accordingly, impairs the corrosion resistance of the deposited coatings.

The structural integrity and resulting desired composition (garnet phase) of the as-deposited coating are noteworthy results. In this regard, the present inventors note that prior research has been conducted, wherein melts of materials having the composition corresponding to the precise stoichiometry of the garnet crystal structure produced mixtures of phases when rapidly cooled. The integrity and the uniformity of the garnet crystal structure according embodiments of the present invention may be due to incomplete melting of the ceramic powder, whereby unmelted garnet phase grains provide appropriate sites for nucleation and growth.

As discussed above, embodiments of the present invention may take the form of semiconductor processing components or semiconductor processing tools, utilized in connection with forming active semiconductor devices. Typically, the semiconductor processing tool is a deposition apparatus, a diffusion apparatus, an etch apparatus, a chemical mechanical polishing (CMP) apparatus, or an annealing apparatus. The ceramic coating, including the garnet crystal phase as described above, finds particular use in semiconductor etch apparatuses, as such apparatuses are typically exposed to highly reactive gases. As such, the corrosion resistance of the garnet ceramic material may be of advantageous use. In this regard, it is noted that deposition apparatuses also typically are exposed to highly reactive gases, such as during cleaning of the deposition apparatus following deposition of materials on semiconductor wafers.

Figure 5:
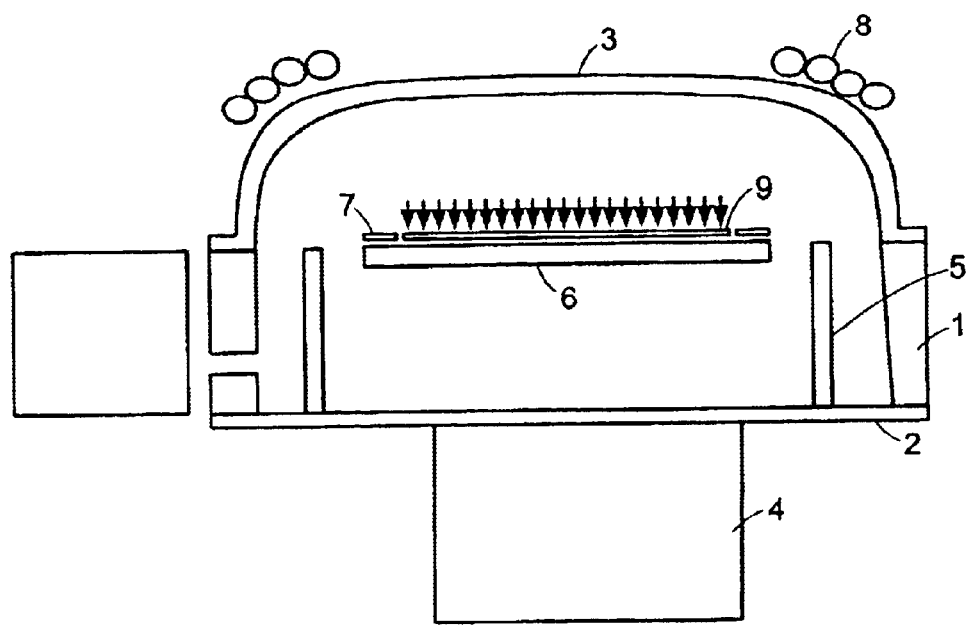
FIG. 5 illustrates a particular semiconductor processing tool, an etch chamber assembly, components of which are coated according to embodiments of the present invention.

Turning to FIG. 5, a semiconductor etch apparatus is illustrated. The etch apparatus includes a chamber having an inner area or volume defined by lid 3 disposed upon the base, composed of the process chamber wall 1 and floor 2. In the particular embodiment shown, the lid is in the form of a dome. A vacuum pump 4 is schematically shown as being connected to the chamber, for evacuation of the chamber. An RF coil 8 for generating a plasma is disposed around the lid 3, and takes on the form of an annular coil. Within the chamber, a liner 5 is disposed so as to surround an electrostatic chuck 6. As is understood in the art, the liner 5 is a sacrificial component which is replaced periodically after a certain number of etch cycles. The electrostatic chuck 6 is disposed so as to support a semiconductor wafer 9, which is surrounded by a focus ring 7. The particular details regarding the operation of the etch apparatus are not described herein, but are well understood by one of ordinary skill in the art. In this regard, the arrows shown in FIG. 5 illustrate the etching action of the chamber while in use, due to generation of plasma within the chamber.

The ceramic coating including the garnet crystal structure as described herein may be advantageously deposed on at least one of several components of the etch apparatus. Most typically, the coating is provided along the inner surface of the lid 3, the upper surface of the electrostatic chuck 6, or the inner surface of process chamber wall 1. Noteworthy, the entirety of the electrostatic chuck 6 may be coated with the ceramic coating including the garnet crystal structure.

While the lid 3, electrostatic chuck 8, and process chamber wall 1 may be advantageously benefited by the coating as described herein, other components of the etch chamber may also be coated for added corrosion resistance. In particular, the focus ring 7 and liner 5 may be coated with the garnet crystal structure coating.

In still a further embodiment of the present invention, a method for forming active semiconductor devices is contemplated. In this embodiment, the silicon wafer, such as silicon wafer 9 illustrated in FIG. 5 is placed into a processing chamber of a semiconductor processing tool, a component of which has the garnet crystal structure ceramic coating (as described herein) coated thereon. Subsequent to processing, the wafer is diced into a plurality of semiconductor die. The processing chamber may be an etch processing chamber as described in connection with FIG. 5. However, the processing chamber may be a component of any one of the semiconductor processing tools described above, namely a deposition apparatus, a diffusion apparatus, a CMP apparatus, and an annealing apparatus.

As is well known in the art, a number of semiconductor processing steps are carried out to form semiconductor active areas on a semiconductor wafer, which areas correspond to semiconductor die. Such steps include ion implanting, annealing, material deposition (including dielectric materials such as silicon nitride and silicon oxide, as well as conductive materials such as aluminum, copper and tungsten) in the form of conductive lines and plugs. Additional steps include planarization via CMP processing steps. After the multi-layered semiconductor active areas are completed, typically the areas are coated with a passivation layer through which contacts are made, which are connected to complementary contacts of a semiconductor package.

Following the multiple semiconductor processing steps as summarized above, the semiconductor wafer is cut into a plurality of semiconductor die followed by test and burn-in. Known good die are then typically packaged, such as by the known C4 technology, flip-chip packaging, or by plastic encapsulation and connection to a lead frame.

According to the foregoing description, various embodiments of the present invention have been described with particularity. However, it is understood that one of ordinary skill in the art may make modifications to the processes and articles described above yet still fall within the scope of the present claims.

What is claimed is:

1. A coated article, comprising:
    a substrate, wherein the substrate is (i) metal, and comprises at least one element from the group consisting of molybdenum, tungsten, iron, nickel, aluminum, and titanium, (ii) silicon, or (iii) silica; and
    a coating directly contacting and overlying the substrate, the coating having a thickness greater than about 10 microns and consisting essentially of a garnet crystal structure, wherein the substrate has a coefficient of thermal expansion at least about 30% greater than or less than a thermal expansion coefficient of the coating.

2. The article of claim 1, wherein the substrate comprises an iron-based or nickel-based superalloy.

3. The article of claim 1, wherein the substrate comprises a stainless steel alloy.

4. The article of claim 1, wherein the coating has a thickness of at least about 50 microns.

5. The article of claim 1, wherein the coating has a thickness at least about 100 microns.

6. The article of claim 1, wherein the predominant phase of the coating and the powder is said garnet crystal structure.

7. A semiconductor processing tool, comprising:
    a substrate, wherein the substrate is (i) metal, and comprises at least one element from the group consisting of molybdenum, tungsten, iron, nickel, aluminum, and titanium, (ii) silicon, or (iii) silica; and
    a coating overlying the substrate, the coating being formed by thermal spraying a ceramic powder comprising a garnet crystal structure, whereby the coating consists essentially of a garnet crystal structure phase, and the coating has a thickness greater than about 10 microns.

8. The tool of claim 7, wherein the processing tool is selected from the group consisting of a deposition apparatus, a diffusion apparatus, an etch apparatus, a chemical mechanical polishing apparatus, and annealing apparatus.

9. The tool of claim 8, wherein the processing tool is an etch apparatus.

10. The tool of claim 9, wherein the etch apparatus includes an etching chamber defined by a base upon which is disposed a lid, the etch apparatus including an electrostatic chuck disposed in the chamber for holding a semiconductor wafer.

11. The tool of claim 10, wherein the substrate includes at least one of the base, the lid, and the electrostatic chuck.

12. The tool of claim 10, wherein the etch apparatus further includes focus ring disposed in the chamber, positioned to surround a semiconductor wafer, and a liner, wherein the electrostatic chuck is disposed radially within the liner.

13. The tool of claim 12, wherein the substrate includes at least one of the ring and the liner.

14. The tool of claim 10, wherein the lid is in the form of a dome.

* * * * *